United States Patent
Huang (10) Patent No.: US 7,474,242 B2
(45) Date of Patent: Jan. 6, 2009

(54) OPERATIONAL AMPLIFIER AND OPERATING METHOD THEREOF

(75) Inventor: Sheng-Jui Huang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 8 days.

(21) Appl. No.: 11/778,645

(22) Filed: Jul. 16, 2007

(65) Prior Publication Data

US 2008/0018510 A1    Jan. 24, 2008

Related U.S. Application Data

(60) Provisional application No. 60/807,721, filed on Jul. 19, 2006.

(51) Int. Cl.
*H03M 3/00* (2006.01)
(52) U.S. Cl. .................................. 341/143; 330/10
(58) Field of Classification Search .............. 341/118, 341/120, 143, 155; 330/10
See application file for complete search history.

(56) References Cited

U.S. PATENT DOCUMENTS 7,098,823 B2 * 8/2006 O'Dowd et al. ............. 341/118
2007/0115049 A1 * 5/2007 Liu .............................. 330/10

OTHER PUBLICATIONS

A 114-dB 68-mW Chopper-Stabilized Stereo Multibit Audio ADC in 5.62 mm2, IEEE Journal of Solid-State Circuits, Dec. 2003, p. 2061~2068, vol. 38, No. 12.
A 1.2-V RF Front-End With On-Chip VCO for PCS 1900 Direct Conversion Receiver in 0.13-um CMOS, IEEE Journal of Solid-State Circuits, p. 384~394, vol. 41, No. 2.

* cited by examiner

*Primary Examiner*—Peguy JeanPierre
(74) *Attorney, Agent, or Firm*—Winston Hsu (57) ABSTRACT

An operational amplifier is disclosed. The operational amplifier comprises an input stage and a loading stage. The input stage receives a differential input signal pair corresponding to a first frequency band. The loading stage is coupled to the input stage. The loading stage outputs an amplified differential output at output nodes. The loading stage comprises a flicker noise source and a modulating device. The modulating device is coupled to the flicker noise source. The modulating device modulates flicker noises into a second frequency band. The modulating device is not within a signal path.

14 Claims, 6 Drawing Sheets

OPERATIONAL AMPLIFIER AND OPERATING METHOD THEREOF

CROSS REFERENCE TO RELATED APPLICATIONS

The application claims the benefit of U.S. Provisional Application No. 60/807,721, which was filed on Jul. 19, 2006 and is included herein by reference.

BACKGROUND

The present invention relates to an operating operational amplifier, and more particularly, to a folded cascode operating amplifier and an operating method thereof.

In applications involving analog-to-digital converter (ADC) chips, the processing of noise signals is a primary concern. For example, in an ADC or a digital-to-analog converter (DAC), increasing the signal-to-noise ratio (SNR) is regarded as an important design consideration. One of the critical factors influencing the SNR is the transistor flicker noise. Flicker noise is an unwanted energy level that is generated when many dangling bonds appear at the interface between an oxide layer and the silicon substrate in the gate terminal of a transistor. When a charge carrier moves on the interface, some carriers are randomly captured and then released to the energy level to allow the drain terminal current to generate flicker noise. Therefore, reducing the flicker noise in an operational amplifier is a primary design concern.

Enlarging the area of a transistor is one method to reduce flicker noise. The energy associated with the flicker noise is related to the voltage source of the transistor gate terminal. The exact relationship is provided below in the following formula (Razavi, B, "Design of Analog CMOS Integrated Circuits", pp. 215, McGraw Hill):

$$\overline{V_n^2} = \frac{K}{C_{OX}WL} \frac{1}{f}$$

From the above-described formula, it can be induced from the inverse proportionality of WL that the component area must increase as (f) noise signal decreases. Moreover, an accompanying stray capacitance acts to increase the chip power load. Generally, noise from a PMOS transistor is less than that of an NMOS transistor.

SUMMARY OF THE INVENTION

One of the objectives of the claimed invention is to therefore provide an operational amplifier with a modulating device to modulate the flicker noise from a current source into a higher frequency.

According to an embodiment of the present invention, an operational amplifier is disclosed. The operational amplifier comprises an input stage, a loading stage, a flicker noise source, and a modulating device. The input stage receives a differential input signal pair corresponding to a first frequency band. The loading stage is coupled to the input stage. The loading stage outputs an amplified differential output at output nodes. The modulating device is coupled to the flicker noise source and the input stage. The modulating device modulates flicker noises into a second frequency band. The modulating device is not within a signal path.

According to another embodiment of the present invention, an operational amplifier is disclosed. The operational amplifier comprises an input stage and a loading stage. The input stage receives a differential input signal pair corresponding to a first frequency band. The loading stage is coupled to the input stage. The loading stage outputs an amplified differential output at output nodes. The loading stage comprises a flicker noise source and a modulating device. The modulating device is coupled to the flicker noise source. The modulating device modulates flicker noises into a second frequency band. The modulating device is not within a signal path.

According to still another embodiment of the present invention, an analog-to-digital converter (ADC) is disclosed. The ADC comprises a sigma-delta modulator and a digital decimation filter. The sigma-delta modulator receives an input signal and generates a first output signal. The sigma-delta modulator comprises a plurality of operational amplifiers. Flicker noises from at least one flicker noise source of the operational amplifiers are modulated by a modulating device from a first frequency band into a second frequency band. The modulating device is not within a signal path. The digital decimation filter receives the first output signal and filters out flicker noises to generate a second output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
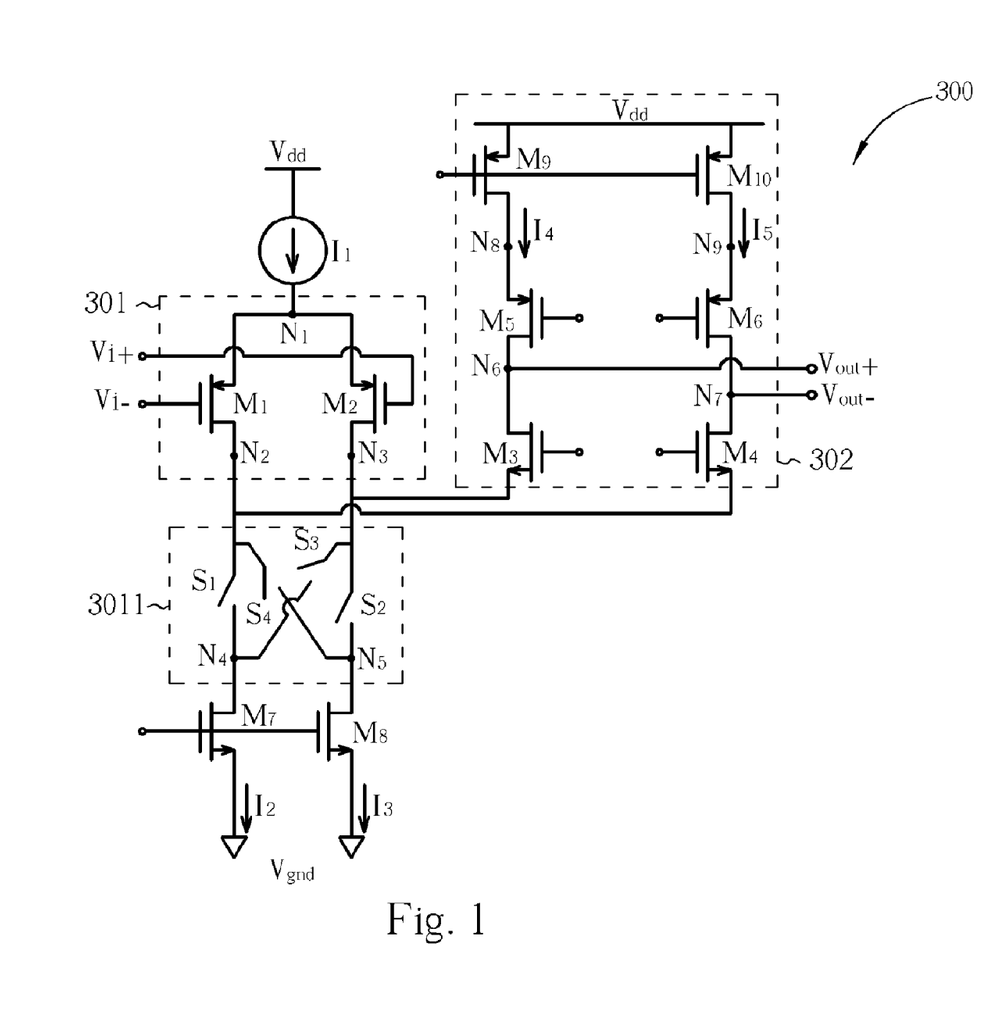
FIG. 1 is a diagram illustrating an operational amplifier according to a first embodiment of the present invention.

Please refer to FIG. 1. FIG. 1 is a diagram illustrating an operational amplifier 300 according to a first embodiment of the present invention. The operational amplifier 300 comprises an input stage 301 and a loading stage 302. The input stage 301 comprises a first and a second transistor M1, and M2. The first and second transistors M1, M2 form a differential pair configuration with source terminals $N_1$ coupled together, and a first current source $I_1$ is further coupled to the terminal $N_1$. A gate of the first transistor M1 and a gate of the second transistor M2 are utilized for receiving a differential input signal pair Vi+, Vi− corresponding to a first frequency band $f_{in}$. Furthermore, the modulating device 3011 is coupled to a drain terminal $N_2$ of the first transistor M1 and a drain terminal $N_3$ of the second transistor M2, a first connecting node $N_4$ is coupled to a second current source $I_2$ (e.g. N-type transistor M7), and a second connecting node $N_5$ is coupled to a third current source $I_3$ (e.g. N-type transistor M8). The loading stage 302 is coupled to the drain terminal $N_2$ of the first transistor M1, and the drain terminal $N_3$ of the second transistor M2, for amplifying outputs at the drain terminal $N_2$ of the first transistor M1 and the drain terminal $N_3$ of the second transistor $M_2$ in order to generate a differential output signal pair Vout+, Vout− at a first output node $N_6$ and a second output node $N_7$. Please note that, in order to describe the spirit of the invention more clearly, the loading stage 302 can be implemented using a cascode configuration, therefore making the present invention become a folded cascode operating amplifier; however, this is not a limitation of the present invention. In the embodiment shown in FIG. 1, the loading stage 302 comprises a third transistor M3, a fourth transistor M4, a fifth transistor M5, and a sixth transistor M6. The source terminals of the third transistor M3 and the fourth transistor M4 are coupled to the terminal $N_2$ and $N_3$, respectively; and the fifth transistor M5 and the sixth transistor M6 are cascoded to the third transistor M3 and the fourth transistor M4 at terminals $N_6$ and $N_7$.

In addition, the modulating device 3011 comprises a first switch $S_1$, a second switch $S_2$, a third switch $S_3$, and a fourth switch $S_4$. The first switch $S_1$ is coupled between the first connecting node $N_4$ and the terminal $N_2$, the second switch $S_2$ is coupled between the second connecting node $N_5$ and the terminal $N_3$; the third switch $S_3$ is coupled between the first connecting node $N_4$ and the terminal $N_3$; and the fourth switch $S_4$ is coupled between the second connecting node $N_5$ and the terminal $N_2$, wherein the first and second switches $S_1$, $S_2$ are controlled by a first control clock $S_{ckl}$, and the third and fourth switches $S_3$, $S_4$ are controlled by a second control clock $S_{cklbar}$, which is the inversed clock of the first control clock $S_{ckl}$.

The embodiment of FIG. 1 further comprises a fourth current source $I_4$ (e.g. P-type transistor M9) coupled to a source terminal $N_8$ of the fifth transistor M5, and a fifth current source $I_5$ (e.g. P-type transistor M10) coupled to the source terminal $N_9$ of the sixth transistor M6.

Figure 2:
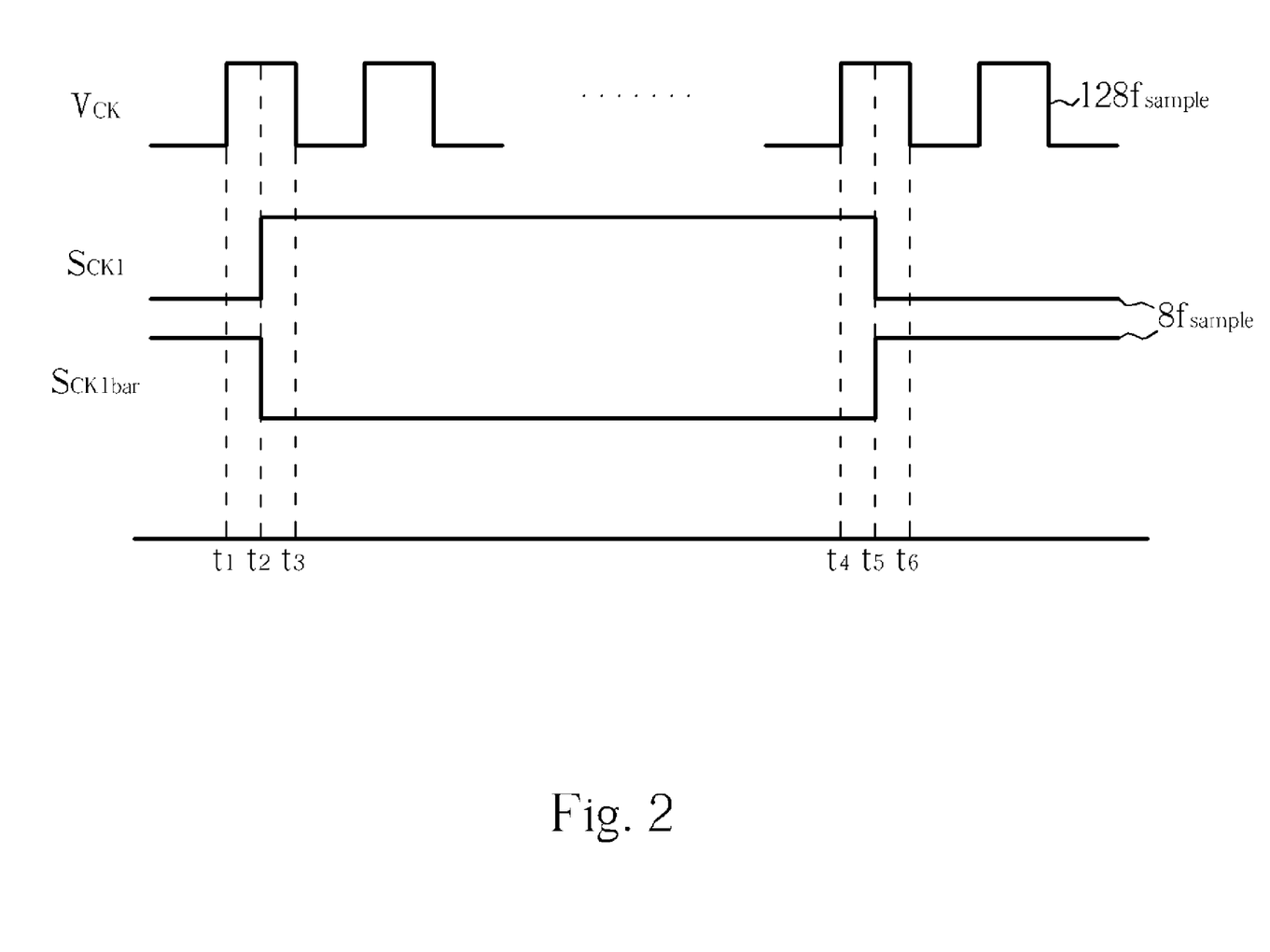
FIG. 2 is a timing diagram illustrating the relationship between the clock rate and the first and second control clocks of the embodiment shown in FIG. 1.

One of the applications of the operational amplifier 300 of the present invention is being the operational amplifier of a Delta-Sigma analog-to-digital converter (Delta-Sigma ADC), but this should not be taken as a limitation of the present invention. Therefore, when the operational amplifier 300 operates in the Delta-Sigma ADC, an internal clock $V_{ck}$ must be accompanied with the differential input signal pair Vi+, Vi−. Furthermore, the frequency of the internal clock $V_{ck}$ can be designed to be 128 times the sampling rate $f_{sample}$ of the Delta-Sigma ADC, and the frequency of the first control clock $S_{ckl}$ and the second control clock $S_{cklbar}$ can be designed to be 8 times the sampling rate. Please note that the determination of the first and second control clocks $S_{ckl}$, $S_{cklbar}$ is prior art, and further description is thus omitted here for brevity. Please refer to FIG. 2. FIG. 2 is a timing diagram illustrating the relationship between the clock rate and the first and second control clock $S_{ckl}$, $S_{cklbar}$ of the embodiment of FIG. 1. Furthermore, it is well-known that the flicker noise generated by the N-type transistor is much higher than that of the P-type transistor, therefore the modulating device 3011 of this embodiment is mainly positioned to block the flicker noise generated by the N-type transistors M7 and M8. On the other hand, the terminals $N_2$ and $N_3$ are the low impedance nodes of the operational amplifier 300, and the modulating device 3011 is not positioned on the signal path of the operational amplifier 300, therefore adding the modulating device 3011 between the terminals $N_2$, $N_3$, and $N_4$, $N_5$ will not affect the differential input signal pair Vi+, Vi− that is to be amplified. A signal path is a path from a signal input node to a signal output node for transmitting a wanted signal.

In FIG. 2, the first control clock $S_{ckl}$ turns on the first switch $S_1$ and the second switch $S_2$ at time $t_2$ to link the first connecting node $N_4$ and the terminal $N_2$, and to link the second connecting node $N_5$ and the terminal $N_3$ respectively. In this embodiment, the time $t_2$ is located between the time $t_1$ and $t_3$, which is the high level of the internal clock $V_{ck}$. Meanwhile, the second control clock $S_{cklbar}$ turns off the third switch $S_3$ and the fourth switch $S_4$ at time $t_1$. After 8 cycles of the internal clock $V_{ck}$, the first control clock $S_{ckl}$ turns off the first switch $S_1$ and the second switch $S_2$ at time $t_5$, while the second control clock $S_{cklbar}$ turns on the third switch $S_3$ and the fourth switch $S_4$ to link the first connecting node $N_4$ and the terminal $N_3$, and to link the second connecting node $N_5$ and the terminal $N_2$ respectively. Similarly, the time $t_5$ is located between the time $t_4$ and $t_6$, which is the high level of the internal clock $V_{ck}$. Then, the modulating device 3011 will repeat to switch between the first connecting node $N_4$ and the terminal $N_2$, and the second connecting node $N_5$ and the terminal $N_3$. Accordingly, the flicker noise generated by the N-type transistors M7 and M8 will be modulated to odd harmonics of the frequency of the first and second control clocks $S_{ckl}$, $S_{cklbar}$ at the first output node $N_6$ and the second output node $N_7$. Furthermore, because the modulating device 3011 is not positioned on the signal path of the operational amplifier 300, a down modulation is not needed. Therefore, one modulating device is sufficient in the embodiment.

Figure 3:
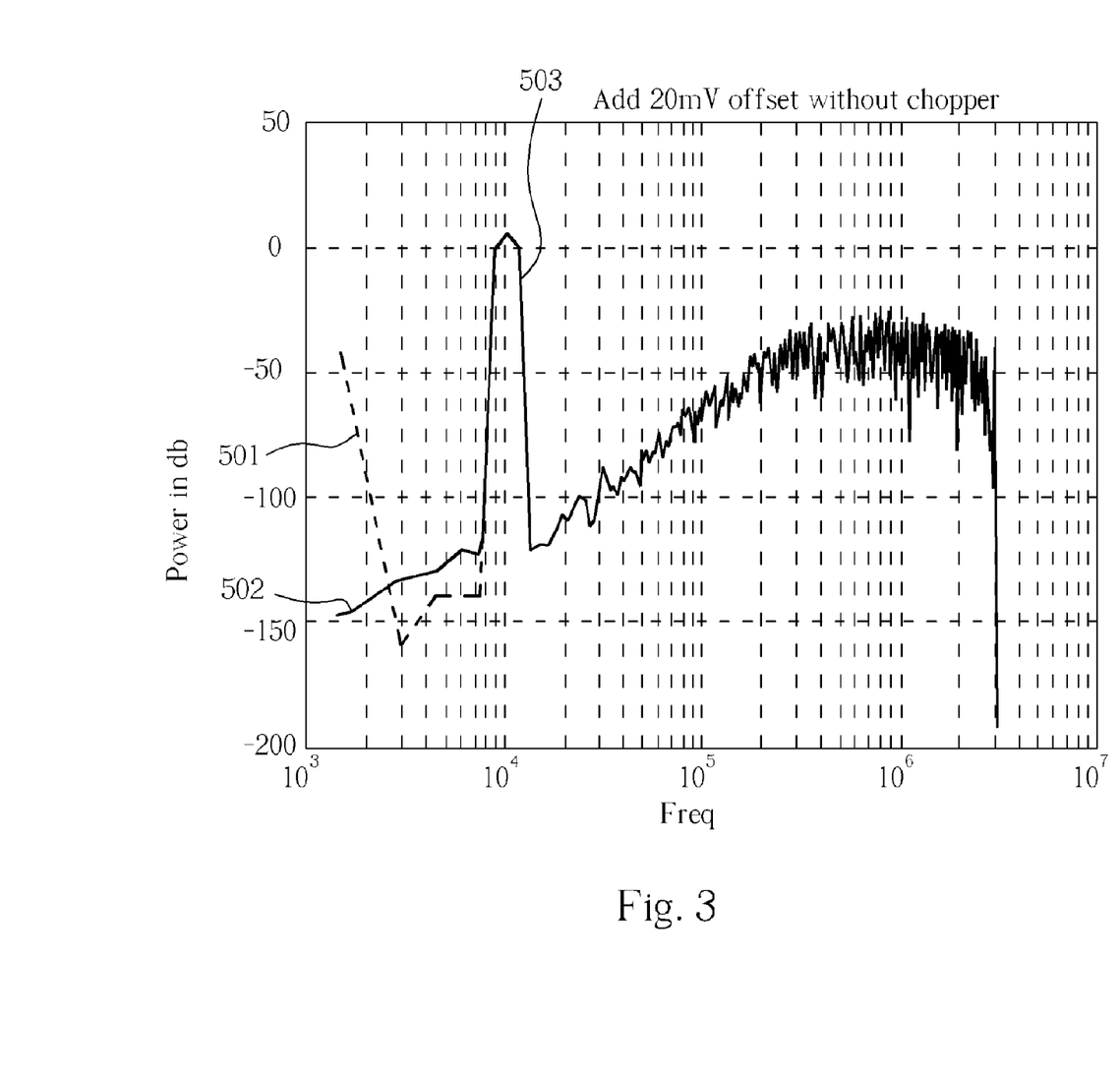
FIG. 3 is a simulation diagram illustrating the output power (dB) versus the frequency (Hz) of the embodiment of FIG. 1.

Please refer to FIG. 3. FIG. 3 is a simulation diagram illustrating the output power (dB) versus the frequency (Hz) of the embodiment of FIG. 1. The simulation result is obtained by adding 20 mV offset at the differential input signal pair Vi+, Vi−. When the modulating device 3011 is discarded from the operational amplifier 300, the noise at low frequency will increase tremendously at the output of the amplifier, as shown by the dotted line 501. However, when the modulating device 3011 is implemented in the operational amplifier 300, the noise at low frequency will be removed at the output of the amplifier, as shown by the line 502. The line 503 represents the power of the output signal at the desired frequency, which is at about 10 KHz. Accordingly, using only one modulating device in the present invention can achieve excellent performance in the noise figure of the operational amplifier.

Figure 4:
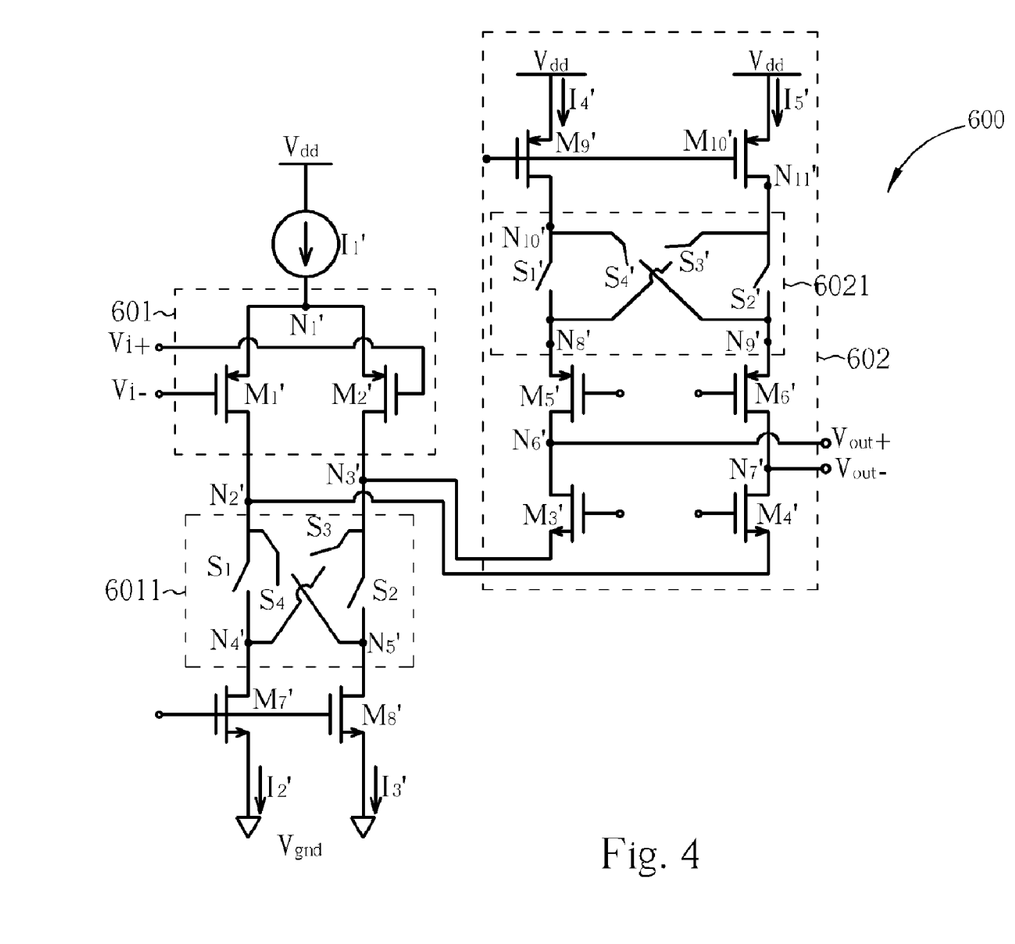
FIG. 4 is a diagram illustrating an operational amplifier according to a second embodiment of the present invention.

Please refer to FIG. 4. FIG. 4 is a diagram illustrating an operational amplifier 600 according to a second embodiment of the present invention. The operational amplifier 600 comprises an input stage 601 and a loading stage 602. The input stage 601 comprises a first and a second transistor M1', and M2'. The first and second transistors M1', M2' form a differential pair configuration with source terminals $N_1'$ coupled together, and a first current source $I_1'$ further coupled to the terminal $N_1'$. A gate of the first transistor M1' and a gate of the second transistor M2' are utilized for receiving a differential input signal pair Vi+, Vi− corresponding to a first frequency band $f_{in}$. Furthermore, the first modulating device 6011 is coupled to a drain terminal $N_2'$ of the first transistor M1' and a drain terminal $N_3'$ of the second transistor M2', a first connecting node $N_4'$ is coupled to a second current source $I_2'$ (e.g. N-type transistor M7'), and a second connecting node $N_5'$ is coupled to a third current source $I_3'$ (e.g. N-type transistor M8'). The loading stage 602 is coupled to the drain terminal $N_2'$ of the first transistor M1' and the drain terminal $N_3'$ of the second transistor M2', for amplifying outputs at the drain terminal $N_2'$ of the first transistor M1' and the drain terminal $N_3'$ of the second transistor M2' to generate a differential output signal pair Vout+, Vout− at a first output node $N_6'$ and a second output node $N_7'$ respectively. Please note that, in order to describe the spirit of the invention more clearly, the loading stage 602 can be implemented using a cascode configuration, therefore making the present embodiment become a folded cascode operating amplifier; however, this is not a limitation of the present invention. In the embodiment shown in FIG. 4, the loading stage 602 comprises a third transistor M3', a fourth transistor M4', a fifth transistor M5', a sixth transistor M6', and a second modulating device 6021. The source terminals of the third transistor M3' and the fourth transistor M4' are coupled to the terminal $N_2'$ and $N_3'$, respectively; and the fifth transistor M5' and the sixth transistor M6' are cascoded to the third transistor M3' and the fourth transistor M4' at terminals $N_6'$ and $N_7'$.

Furthermore, the second modulating device 6021 is coupled to a source terminal $N_8'$ of the fifth transistor M5' and a source terminal $N_6'$ of the sixth transistor M6', a third connecting node $N_{10}'$ is coupled to a fourth current source $I_4'$ (e.g. P-type transistor M9'), and a fourth connecting node $N_{11}'$ is coupled to a fifth current source $I_5'$ (e.g. P-type transistor M10'). Please note that the configuration and the operation of the first modulating device 6011 and the second modulating device 6021 are mostly the same as the modulating device 3011 of FIG. 1, thus the detailed description of the first modulating device 6011 and the second modulating device 6021 are omitted. A skilled person will easily understand that the second modulating device 6021 is utilized for modulating the flicker noise generated by P-type transistors M9', M10' to odd harmonics of the frequency of the control clock of the second modulating device 6021 after reading the above disclosure in view of FIG. 1. Furthermore, please note that the control clock of the first modulating device 6011 is not necessarily the same as the control clock of the second modulating device 6012. In other words, the frequency of the control clock of the first modulating device 6011 can be different from the control clock of the second modulating device 6012.

Figure 5:
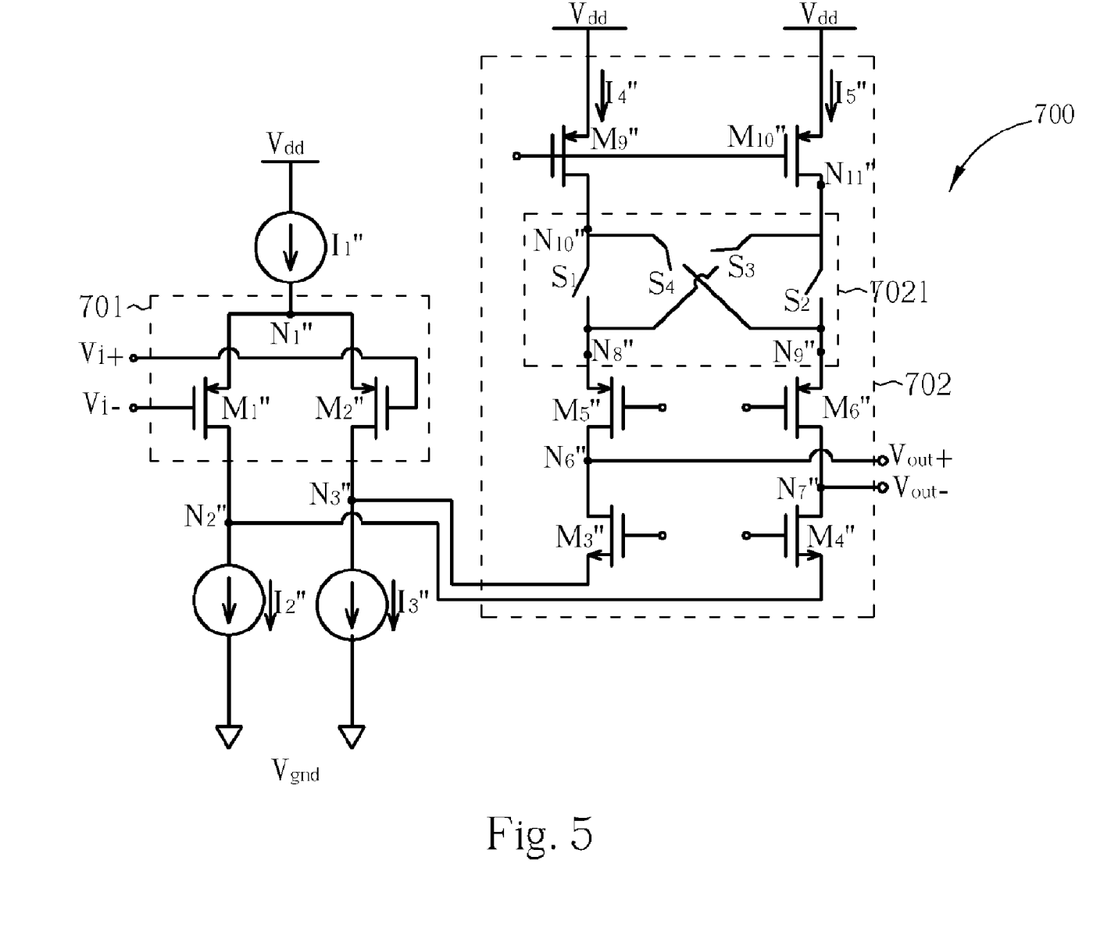
FIG. 5 is a diagram illustrating an operational amplifier according to a third embodiment of the present invention.

Please refer to FIG. 5. FIG. 5 is a diagram illustrating an operational amplifier 700 according to a third embodiment of the present invention. The operational amplifier 700 comprises an input stage 701 and a loading stage 702. The input stage 701 comprises a first and a second transistor M1", M2". The first and second transistors M1", M2" form a differential pair configuration with source terminals $N_1"$ coupled together, and a first current source $I_1"$ further coupled to the terminal $N_1"$. A gate of the first transistor M1" and a gate of the second transistor M2" are utilized for receiving a differential input signal pair Vi+, Vi− corresponding to a first frequency band $f_{in}$. Furthermore, a drain terminal $N_2"$ of the first transistor M1' is coupled to a second current source $I_2"$ and a drain terminal $N_3"$ of the second transistor M2' is coupled to a third current source $I_3"$. The loading stage 702 is coupled to the drain terminal $N_2"$ of the first transistor M1" and the drain terminal $N_3"$ of the second transistor M2", for amplifying outputs at the drain terminal $N_2"$ of the first transistor M1" and the drain terminal $N_3"$ of the second transistor M2" to generate a differential output signal pair Vout+, Vout− at a first output node $N_6"$ and a second output node $N_7"$. In this embodiment, the loading stage 702 is implemented using a cascode configuration, therefore making the present embodiment become a folded cascode operating amplifier; however, this is not a limitation of the present invention. In the embodiment of FIG. 5, the loading stage 702 comprises a third transistor M3", a fourth transistor M4", a fifth transistor M5", a sixth transistor M6", and a modulating device 7021. The source terminals of the third transistor M3" and the fourth transistor M4" are coupled to the terminal $N_2"$ and $N_3"$, respectively; and the fifth transistor M5" and the sixth transistor M6" are cascoded to the third transistor M3" and the fourth transistor M4" at terminals $N_6"$ and $N_7"$.

Furthermore, the modulating device 7021 is coupled to a source terminal $N_8"$ of the fifth transistor M5" and a source terminal $N_6"$ of the sixth transistor M6", a first connecting node $N_{10}"$ is coupled to a fourth current source $I_4"$ (e.g. P-type transistor M9"), and a second connecting node $N_{11}"$ is coupled to a fifth current source $I_5"$ (e.g. P-type transistor M10"). Please note that the configuration and the operation of the modulating device 7021 is mostly the same as the modulating device 3011 of FIG. 1, and thus a detailed description of the modulating device 7021 is omitted. A skilled person will easily understand that the modulating device 7021 is utilized for modulating the flicker noise that is generated by P-type transistors M9", M10" to odd harmonics of the frequency of the control clock of the modulating device 7021 after reading the disclosure in view of FIG. 1.

Figure 6:
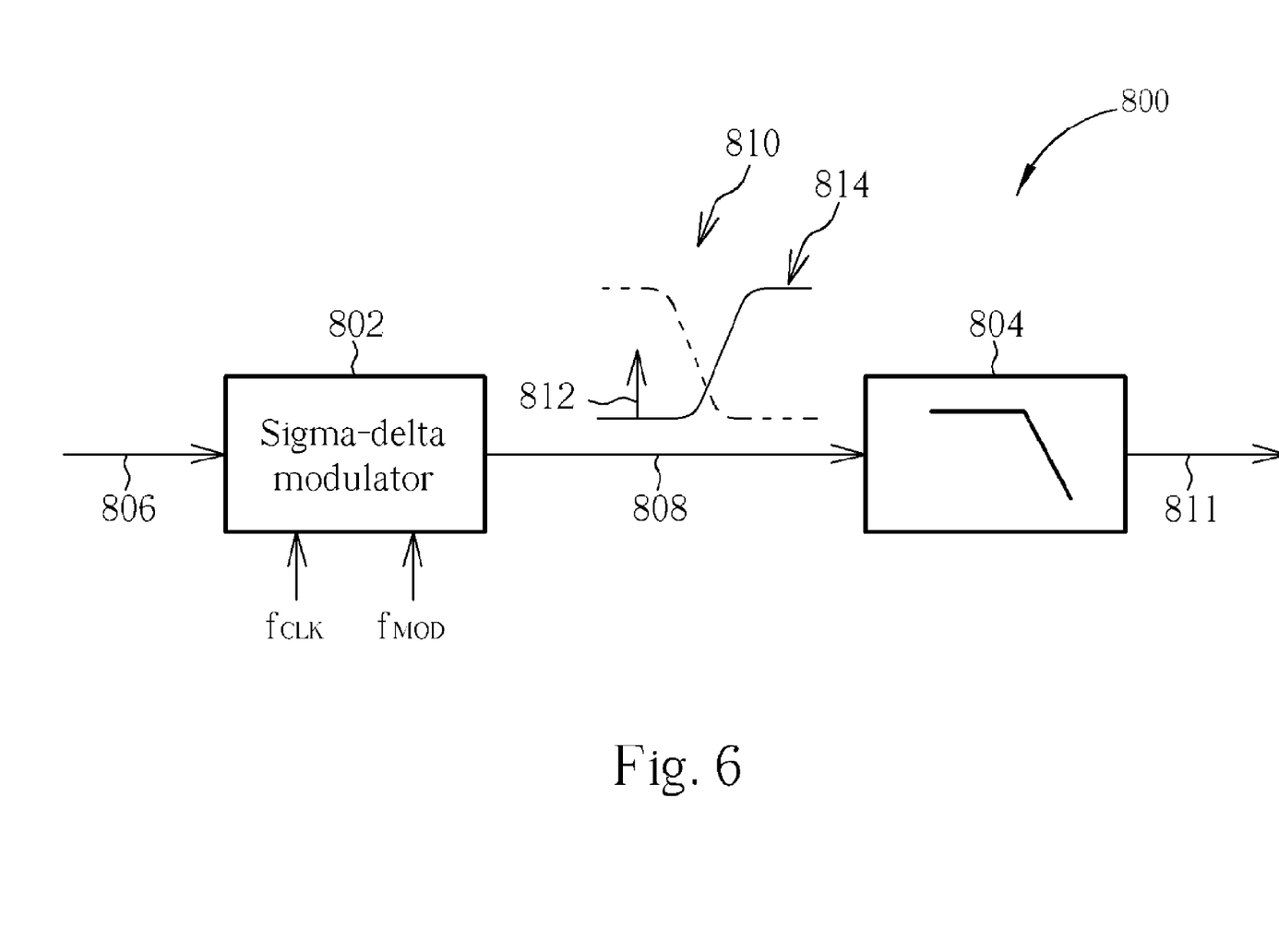
FIG. 6 shows a diagram of an ADC using sigma-delta modulation technique.

The operational amplifiers mentioned in the above description can be used in an analog-to-digital converter (ADC) using sigma-delta modulation technique. FIG. 6 shows a diagram of an ADC using sigma-delta modulation technique. The ADC 800 comprises a sigma-delta modulator 802 and a digital decimation filter 804. The sigma-delta modulator 802 may comprise a plurality of operational amplifiers and each of the operational amplifiers may have flicker noise sources, such as current sources. Embodiments of operational amplifiers mentioned in the above description can be implemented into the sigma-delta modulator 802 for modulating flicker noises into a higher frequency band.

For example, as shown in FIG. 6, an input signal 806 is inputted into, and processed by the sigma-delta modulator 802 to generate a first output signal 808. Flicker noises of the operational amplifiers in the sigma-delta modulator 802 are modulated by a modulating device (such as the modulating device 3011 in FIG. 1) into a higher frequency band (such as the higher frequency band 814 shown in FIG. 6). A frequency domain diagram 810 is used to illustrate frequency components of the first output signal 808. In the frequency domain diagram 810, flicker noises have been modulated from a lower frequency band into a higher frequency band 814. Thus, quantization noises and modulated flicker noises are all within the higher frequency band 814. The desired signal 812 is left at a lower frequency band.

In this embodiment, there are two clock inputs. One with frequency $f_{CLK}$, and the other with frequency $f_{MOD}$. $f_{CLK}$ is the over-sampling frequency of the sigma-delta modulator 802, which could be $256 \times f_S$, $128 \times f_S$, $64 \times f_S$, or other values, depending upon designers' choice, where $f_S$ is the sampling frequency of the ADC. $f_{MOD}$ is the frequency of the modulating device for modulating flicker noises.

The digital decimation filter 804, serving as a low-pass filter, can filter out the higher frequency band 814 and let the desired signal 812 pass through. Therefore, a second output signal 811 outputted by the digital decimation filter 804 has only the desired signal.

Removing flicker noises is especially important in audio signal processing because an audio signal is at a low frequency band (usually ranging from 20 Hz to 20 kHz). These embodiments can achieve good performance for audio signal processing.

The frequency of the control clock of the modulating device 3011 can be different from the control clock of the modulating device 7012. A skilled person will easily understand the steps of the noise reduction method, and therefore a detailed description is omitted for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier, comprising:
an input stage for receiving a differential input signal pair corresponding to a first frequency band;
a loading stage coupled to the input stage, the loading stage outputting an amplified differential output at output nodes;
a flicker noise source; and
a first modulating device coupled to the flicker noise source and coupled to the input stage, the first modulating device modulating flicker noises into a second frequency band, wherein the first modulating device is not within a signal path.

2. The operational amplifier of claim 1, wherein the flicker noise source is a current source.

3. The operational amplifier of claim 1, wherein the input stage further comprises:
a first transistor; and
a second transistor, having a source terminal coupled to a source terminal of the first transistor and a first voltage supply source, wherein a gate of the first transistor and a gate of the second transistor are utilized for receiving the differential input signal pair corresponding to the first frequency band;
wherein the output nodes comprises a first output node and a second output node, and the first modulating device is coupled to a drain terminal of the first transistor, a drain terminal of the second transistor, a first connecting node coupled to a second voltage supply source, and a second connecting node coupled to the second voltage supply source;
wherein the amplified differential output is a differential output signal pair, the loading stage is coupled to the drain terminal of the first transistor, the drain terminal of the second transistor, and the first voltage supply source, for amplifying outputs at the drain terminal of the first transistor and the drain terminal of the second transistor to generate the differential output signal pair at the first output node and the second output node; and
wherein the first modulating device switches between connections linking the drain terminal of the first transistor and the first connecting node and linking the drain terminal of the second transistor and the second connecting node, and connections linking the drain terminal of the first transistor and the second connecting node and linking the drain terminal of the second transistor and the first connecting node for modulating noise signals corresponding to the first frequency band to the second frequency band.

4. The operational amplifier of claim 3, wherein the first modulating device comprises:
a first switch, coupled between the first connecting node and the drain of the first transistor;
a second switch, coupled between the second connecting node and the drain of the second transistor;
a third switch, coupled between the first connecting node and the drain of the second transistor; and
a fourth switch, coupled between the second connecting node and the drain of the first transistor, where the first and second switches are controlled by a first control signal, and the third and fourth switches are controlled by an inversed signal of the first control signal.

5. The operational amplifier of claim 4, further comprising:
a second modulating device, coupled between a third connecting node coupled to the first voltage supply source, a fourth connecting node coupled to the first voltage supply source, the first output node, and the second output node, for switching between connections linking the third connecting node and the first output node and linking the fourth connecting node and the second output node, and connections linking the fourth connecting node and the first output node and linking the third connecting node and the second output node to modulate noise signals corresponding to the first frequency band to the second frequency band.

6. The operational amplifier of claim 5, wherein the second modulating device comprises:
a fifth switch, coupled between the third connecting node and the first output node;
a sixth switch, coupled between the fourth connecting node and the second output node;
a seventh switch, coupled between the fourth connecting node and the first output node; and
an eighth switch, coupled between the third connecting node and the second output node, where the fifth and sixth switches are controlled by a second control signal, and the seventh and eighth switches are controlled by an inversed signal of the second control signal.

7. The operational amplifier of claim 3, further comprising:
a second modulating device, coupled between a third connecting node coupled to the first voltage supply source, a fourth connecting node coupled to the first voltage supply source, the first output node, and the second output node, for switching between connections linking the third connecting node and the first output node and linking the fourth connecting node and the second output node, and connections linking the fourth connecting node and the first output node and linking the third connecting node and the second output node to modulate noise signals corresponding to the first frequency band to the second frequency band.

8. The operational amplifier of claim 7, wherein the second modulating device comprises:
a fifth switch, coupled between the third connecting node and the first output node;
a sixth switch, coupled between the fourth connecting node and the second output node;
a seventh switch, coupled between the fourth connecting node and the first output node; and
an eighth switch, coupled between the third connecting node and the second output node, where the fifth and sixth switches are controlled by the first control signal, and the seventh and eighth switches are controlled by an inversed signal of the first control signal.

9. An operational amplifier, comprising:
an input stage for receiving a differential input signal pair corresponding to a first frequency band;
a loading stage coupled to the input stage, the loading stage outputting an amplified differential output at output nodes, the loading stage comprising:
a flicker noise source;
a first modulating device coupled to the flicker noise source, the first modulating device modulating flicker noises into a second frequency band, wherein the first modulating device is not within a signal path.

10. The operational amplifier of claim 9, wherein the flicker noise source is a current source.

11. The operational amplifier of claim 9, wherein the input stage comprises:
   a first transistor; and
   a second transistor, having a source terminal coupled to a source terminal of the first transistor and a first voltage supply source, wherein a gate of the first transistor and a gate of the second transistor are utilized for receiving the differential input signal pair corresponding to the first frequency band;
wherein the amplified differential output is a differential output signal pair, the output nodes comprises a first output node and a second output node, and the loading stage is coupled to the drain terminal of the first transistor, the drain terminal of the second transistor, and the first voltage supply source, for amplifying outputs at the drain terminal of the first transistor and the drain terminal of the second transistor to generate the differential output signal pair at the first output node and the second output node; and
wherein the first modulating device is coupled between a first connecting node coupled to the first voltage supply source, a second connecting node coupled to the first voltage supply source, the first output node, and the second output node, for switching between connections linking the first connecting node and the first output node and linking the second connecting node and the second output node, and connections linking the second connecting node and the first output node and linking the first connecting node and the second output node to modulate noise signals corresponding to the first frequency band to a second frequency band.

12. The operational amplifier of claim 9, wherein the first modulating device comprises:
   a first switch, coupled between the first connecting node and the first output node;
   a second switch, coupled between the second connecting node and the second output node;
   a third switch, coupled between the second connecting node and the first output node; and
   a fourth switch, coupled between the first connecting node and the second output node, where the first and second switches are controlled by a control signal, and the third and fourth switches are controlled by an inversed signal of the control signal.

13. An analog-to-digital converter, comprising:
   a sigma-delta modulator for receiving an input signal and generating a first output signal, wherein the sigma-delta modulator comprises a plurality of operational amplifiers, flicker noises from at least one flicker noise source of the operational amplifiers are modulated by a modulating device from a first frequency band into a second frequency band, and the modulating device is not within a signal path; and
   a digital decimation filter for receiving the first output signal and filtering out the modulated flicker noises to generate a second output signal.

14. The analog-to-digital converter of claim 13, wherein the flicker noise source is a current source.

* * * * *